(12) United States Patent
Atchison et al.

(10) Patent No.: US 6,393,602 B1
(45) Date of Patent: May 21, 2002

(54) METHOD OF A COMPREHENSIVE SEQUENTIAL ANALYSIS OF THE YIELD LOSSES OF SEMICONDUCTOR WAFERS

(75) Inventors: Nick Atchison, Santa Cruz; Ron Ross, Scotts Valley, both of CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/333,717

(22) Filed: Jun. 15, 1999

Related U.S. Application Data
(60) Provisional application No. 60/105,089, filed on Oct. 21, 1998.

(51) Int. Cl.[7] ............................. G06F 17/50; G06F 19/00
(52) U.S. Cl. ............................................. 716/4; 700/121
(58) Field of Search ............................... 716/1, 2, 4, 5, 716/19; 700/110, 121

(56) References Cited

U.S. PATENT DOCUMENTS

| | | |
|---|---|---|
| 5,440,478 A | 8/1995 | Fisher et al. |
| 5,479,340 A | 12/1995 | Fox et al. |
| 5,483,468 A | 1/1996 | Chen et al. |
| 5,598,341 A | 1/1997 | Ling et al. |
| 5,777,901 A | 7/1998 | Berezin et al. |
| 5,862,054 A | 1/1999 | Li |

OTHER PUBLICATIONS

Effron, "Integrated Yield Management: A Systematic Approach to Yield Management," 1996 IEEE/SEMI Advanced Semiconductor Manufacturing Conference, pp. 397–403.*

Lee, "Advanced Yield Enhancement: Integrated Yield Analysis," 1997 IEEE/SEMI Advanced Semiconductor Manufacturing Conference, pp. 67–75.*

Koyama et al., "Yield Management for Development and Manufacture of Integrated Circuits," 1998 IEEE/SEMI Advanced Semiconductor Manufacturing Conference, pp. 208–211.*

Lee et al., "Yield Analysis and Data Management Using Yield Manager", 1998 IEEE/SEMI Advanced Semiconductor Manufacturing Conference, pp. 19–30.*

"Integrated Circuit Yield Management and Yield Analysis: Development and Implementation," by Charles H. Stapper and Raymond J. Rosner, IEEE Transactions on Semiconductor Manufacturing, vol. 8, No. 2, May 1995, pp. 95–102.

* cited by examiner

Primary Examiner—Matthew Smith
Assistant Examiner—Leigh Marie Garbowski
(74) Attorney, Agent, or Firm—W. Daniel Swayze, Jr.; W. James Brady; Frederick J. Telecky, Jr.

(57) ABSTRACT

A method for improving yield management of semiconductors being inspected for defects. The method uses critical area analysis, spacial analysis, yield loss node analysis, yield loss manufacturing location, and yield loss cause analysis for both in-line monitors and at each node due to situational circumstances.

2 Claims, 11 Drawing Sheets

METHOD OF A COMPREHENSIVE SEQUENTIAL ANALYSIS OF THE YIELD LOSSES OF SEMICONDUCTOR WAFERS

CROSS-REFERENCES TO RELATED APPLICATIONS

This Appln claims benefit of Prov. No. 60/105,089 filed Oct. 21, 1998.

The copending patent application bearing Ser. No. 09/334,057, titled "An Improved Computer Program for Calculation of Parametric Yield Limits," filed Jun. 15, 1999, is incorporated by reference in its entirety.

The copending patent application bearing Ser. No. 09/333,713, titled "Method for the Calculation of Wafer Probe Yield Limits from In-Line Defect Monitor Data," filed Jun. 15, 1999, is incorporated by reference in its entirety.

The copending patent application bearing Ser. No. 09/333,787, titled "Method for Analyzing Probe Yield Sensitivities to IC Design," filed Jun. 15, 1999, is incorporated by reference in its entirety.

The copending patent application bearing Ser. No. 09/333,848, titled "A New Method for Wafer Zone Based Yield Analysis," filed Jun. 15, 1999, is incorporated by reference in its entirety.

FIELD OF THE INVENTION

The present invention generally relates to semiconductor wafer manufacture in the presence of particle contamination, and more particularly to the field of yield forecasting in a real-time semiconductor wafer manufacturing environment.

BACKGROUND OF THE INVENTION

Fabrication of semiconductor integrated circuits (ICs) is an extremely complex process that involves several hundred or more operations. They are fabricated by selectively implanting impurities into and applying conductive and insulative layers onto a semiconductor substrate. Semiconductor ICs (chips) are not manufactured individually but rather as an assembly of a hundred or more chips on a "wafer," which is then diced up to produce the individual chips.

Increasing production yield is an ongoing problem in the manufacture of semiconductor chips. Because of various defects that can occur in the fabrication of a wafer, a significant number of wafer die have to be discarded for one reason or another, thereby decreasing the percentage yield per wafer and driving up the cost of the individual chips. Defects are typically caused by foreign particles, minute scratches, and other imperfections introduced during photoresist, photomask, and diffusing operations. Yield impacts the number of wafer starts at the inception of production needed to meet specific customer order quantities for finished chips at the end of the production line. With the high demand for semiconductor chips and more orders than can possibly be filled by a production facility, predicting yield to accurately gauge wafer starts and utilizing defect information to remove yield-detracting operations are important aspects of improving the efficiency and hence the output of the fabrication facility.

Wafer-scanning tools are utilized to identify defects that occur in the chip manufacturing process for the aforementioned purposes. Typically, such tools are located at a variety of positions along the production line and include automated-vision inspection stations for identifying visual irregularities in the wafer die as they move through the line. The irregularities, i.e., defects, are recorded according to their coordinates, estimate of size, or other parameters and are stored as records in a database. The records represent raw information that is then analyzed or otherwise processed offline to determine the impact, if any, of the identified defects on product yield. Some defects, for example, may not adversely affect yield as much as others, and correspondingly must be classified differently for analysis purposes.

Commercially available wafer scanning tools include those made by KLA Instruments Corporation of Santa Clara, Calif.; Tencor Instruments Corporation of Mountain View, Calif.; Inspex, Inc. of Billerica, Mass.; and numerous other manufacturers. Despite significant advances made in wafer-scanning technology, the various tools that are available suffer striking deficiencies. In particular, such tools lack the capability to perform certain advanced classification and analysis of defect information necessary to accurately determine the true impact of wafer defects on yield. While conventional tools offer simple data presentation capabilities, such as the display of wafer maps, histograms and charts, they do not adequately classify or process the defect data.

More specifically, a disadvantage suffered by scanning tools is that they do not adequately perform yield prediction operations beneficial in a manufacturing defect analysis, thereby limiting the utility. It is often desirable to further refine the defect data before manual inspection and classification of individual defects on the review station. Since each wafer can include so many defects, it would not be practical to manually review and classify each of them. It would be desirable to utilize a method to randomly choose a statistically meaningful sample, i.e., subset, of such defects for consideration.

Historically, the review station operator randomly picks sets of defects that seem interesting and then reviews and classifies them. However, it is difficult for humans to systematically choose defects for this purpose that will be representative of all of the defects on the wafer. Some review stations are equipped with the ability to randomly move to different defects which the operator can then review and classify. A problem though with conventional randomizing methods performed on review stations is that they are not necessarily accurate in representing a true sampling of the wafer. For example, picking defects at random tends to result in the inordinate picking of defects that are part of a big cluster, because there are more of them, while defects of other types and in other locations on the wafer are overlooked. Therefore, it would be desirable to adopt an automated and consistent method for randomly identifying for review defects of interest. This method could focus on defect subpopulations defined in terms of defect size ranges or, alternatively, in terms of locations on the wafer, so that the sample of defects chosen best reflects the conditions actually occurring on the wafer.

Figure 1:
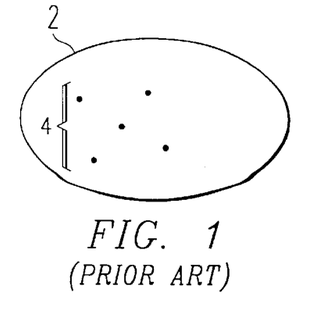
FIG. 1 is an illustration of a semiconductor wafer with a small particle count.
Figure 2:
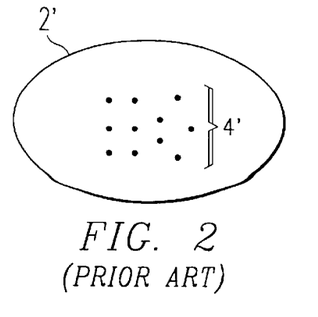
FIG. 2 is an illustration of a semiconductor wafer with a high particle count.

FIGS. 1 and 2 illustrate a semiconductor wafer 2, which includes five particles 4, and the semiconductor wafer 2' contains eleven particles 4'.

Figure 3:
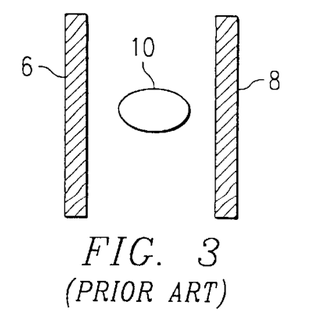
FIG. 3 is an illustration of a portion of a semiconductor device where no killer defects are experienced.

FIG. 3 illustrates a schematic illustration of a semiconductor device in a semiconductor wafer. Circuit conductor lines 6 and 8 are designed in the semiconductor wafer to conduct electrical signals independently of one another. Due to imperfections in the semiconductor wafer manufacturing process, particle 10 has been introduced between conductors 6 and 8. Particle 10 does not interfere with either of conductors 6 and 8 and will generally not affect the functionality (or yield) of the semiconductor device or wafer.

Accordingly, even though particle 10 is a result in a defect in the semiconductor wafer manufacturing process, the particle does not cause failure in the semiconductor device by disturbing signals flowing in conductors 6 and 8.

Figure 4:
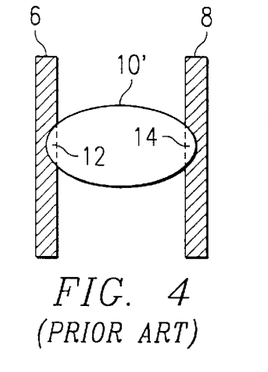
FIG. 4 is an illustration of a portion of a semiconductor device which has experienced a killer defect.

FIG. 4 is also a schematic illustration of a portion of a semiconductor device similar to the illustration of FIG. 3. However, in FIG. 4, particle 10' is much larger than particle 10 of FIG. 3. In this example, particle 10' is in contact with both conductors 6 and 8 at regions 12 and 14, respectively. If particle 10' is able to conduct electricity, the independent operation of conductors 6 and 8 will be jeopardized, creating cross-talk between conductors 6 and 8. If different devices are connected to conductors 6 and 8, a single particle 10' may destroy the two devices embedded in the semiconductor wafer. Accordingly, particle 10' is what is commonly known as a "killer defect" since particle 10' may kill or prevent the normal operation of the semiconductor device which utilizes conductors 6 and 8. While the presence or absence of killer defects may be determined, it is important to utilize the defect characteristics in a semiconductor wafer.

Figures 5, 6:
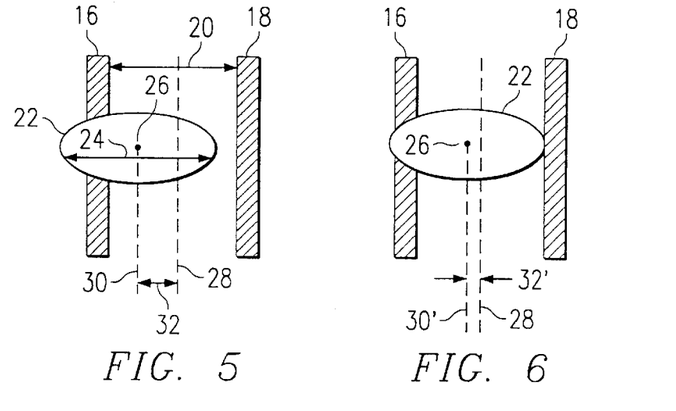
FIG. 5 is an illustration of a semiconductor device describing the relationship of the center of the particle and the center of the device conductors when no killer defect is present.
FIG. 6 is an illustration of a semiconductor device describing the relationship between the center of the particle and the center of the device conductors when a killer defect is present.

FIGS. 5 and 6 are schematic illustrations of a portion of a semiconductor device for providing some additional background information regarding semiconductor defects. In FIG. 5, semiconductor device conductor lines 16 and 18 are separated by the distance 20. During the manufacturing process, particle 22 is introduced in the semiconductor wafer due to manufacturing defects or imperfections. Particle 22 has a diameter 24 and center point 26 as illustrated. In the situation illustrated in FIG. 5, particle 22 is in contact only with conductor 16 and is unable to be extended to contact both conductors 16 and 18. Therefore, particle 22 is considered to be a non-killer defect. Note that in this situation, the position of center 26 of particle 22, identified by dashed line 30, is spaced apart from the center position 28 of conductors 16 and 18 by distance 32. As particle 22 moves closer toward conductor 18, the center 26 of particle 22 will also move closer to center 28 or conductors 16 and 18 as illustrated in FIG. 6.

As shown in FIG. 6, the center 26 of particle 22 has moved closer to the center 28 of conductors 16 and 20. This is illustrated by the distance between center 28 and center line 30' being 32' which is smaller than the distance 32 in FIG. 5. Particle 22 is in contact with both conductors 16 and 20 and, correspondingly, is considered a killer defect. Thus, as the center 26 of particle 22 is moved closer to center 28 of conductors 16 and 20, the particle 22 will become more likely a killer defect. This, of course, presumes that particle 22 is large enough to be in simultaneous contact with both conductors 16 and 20.

SUMMARY OF THE INVENTION

A method for integrated yield management of semiconductor wafers being inspected for defects in a factory is disclosed. The present invention includes the steps of defining and using a critical area analysis to predict yield impact of pattern disturbing defects; defining and using spacial analysis to calculate the ratio of yield loss due to randomly distributed yield loss and regionally bound yield loss; defining and using yield loss mode analysis to quantify the extent of yield loss being attributed to modes related to each type of spacial yield loss; defining and using a yield loss manufacturing location to quantify yield loss during the manufacturing process for each yield loss mode; defining and using yield loss cause analysis to quantify yield loss at each node for each mode of yield loss due to variations in nodes of in-line monitors; and defining and using yield loss cause analysis to quantify yield loss at each node for each mode of yield loss due to node situational circumstances.

DETAILED DESCRIPTION OF THE PRESENT INVENTION

The present invention is a comprehensive, synergistic, multi-faceted approach for analyzing and quantifying a large number of sources of yield loss for digital, analog, or mixed-signal integrated circuits. The present invention includes a "limited yield" approach in which once all of the independent yield limits are ascertained, these can be multiplied together to obtain the overall expected yield. The present invention achieves a calculated yield that is typically within 1% of the actual yield.

The sources of yield loss or, conversely, the yield limits can be divided up into four general categories: (1) Design Yield Limits; (2) Process Systematic Yield Limits; (3) Test Yield Limits; and (4) Random Defect Yield Limits.

Figure 7:
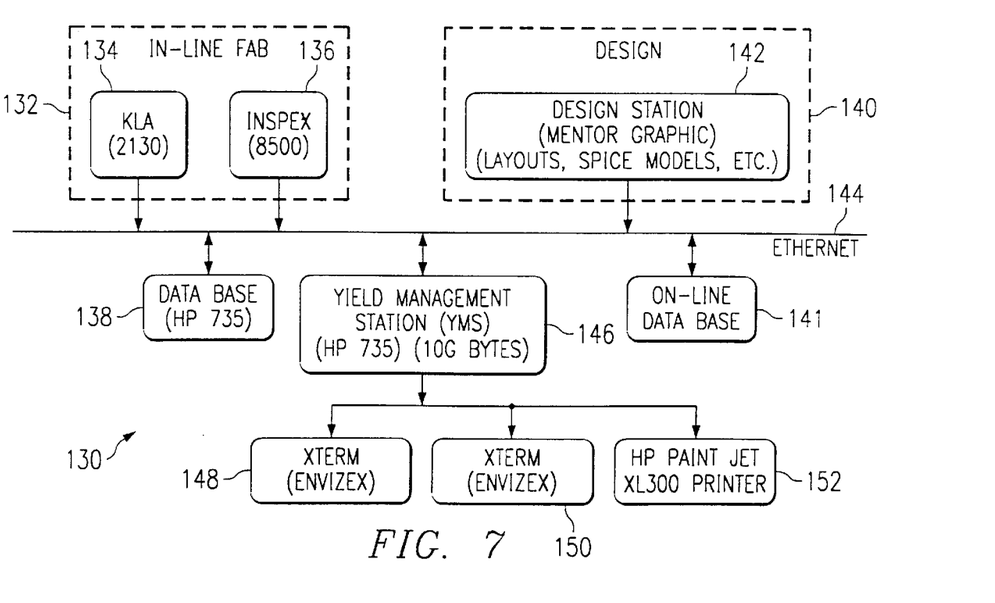
FIG. 7 is a block diagram illustrating a real-time in-line defect disposition and yield forecasting system.

FIG. 7 is a block diagram of the equipment in the real-time, in-line defect disposition and yield forecasting system. As shown in FIG. 7, the real-time, in-line defect disposition and yield forecasting system 130 includes an in-line fabrication equipment 132 which collects different particle sizes and locations of the particle sizes with respect to different layers in a semiconductor wafer. For example, the in-line fabrication equipment KLA 2130 manufactured by KLA Company in Sunnyvale, Calif., identified by reference numeral 134, or the INSPEX 8500 fabrication equipment manufactured by INSPEX Company in Boston, Mass., identified by reference numeral 136, may be used. The collected data is then transmitted via Ethernet drive transmission line 144 to data base 138. For example, the Hewlett Packard 735 computer includes such a function of collecting the data output from the in-line fabrication equipment 132 and storing for later retrieval.

In addition, the defect disposition and yield forecasting system 130 includes design station equipment 140 such as the design equipment 142 manufactured by Mentor Graphics in Oregon. Design station 142 is able to extract the various layouts for each layer in the semiconductor wafer as previously discussed. These layouts are then stored in data base 141 via Ethernet driven transmission line 144. The particle size and locations stored in data base 138 and the layout information stored in database 141 are then collected by the yield management station (YMS) 146 to determine the number and location of actual defects, as well as the defect sensitive area index for each of the layers in the semiconductor wafer under examination. Yield management station 146 can be, for example, Hewlett Packard's 735 computer with preferably 10 gigabytes of hard disk memory storage or more programmed in accordance with the present invention. The particle size and location information and layout information are then analyzed as described in connection with the present invention, the results of which are then displayed on monitors 148 and 150 or printed on printer 152. Examples of monitors 148 and 150 are the Exterm Display manufactured by Envizex. An example of the printer 152 is the Hewlett Packard Paint Jet XL300 printer.

Accordingly, the real-time in-line defect disposition and yield forecasting system is able to determine the number of actual defects caused for each layer of a semiconductor wafer and is also able to determine the defect sensitive area index for each layer of the semiconductor wafer. Using this detailed information, the real-time in-line defect disposition and yield forecasting system is able to accurately determine the status or condition of each layer of the semiconductor wafer to determine the layer which has the highest yield probability or possibility after inspection and analysis. Accordingly, the defect disposition and yield forecasting system is able to efficiently and effectively determine which layer of a semiconductor wafer requires inspection and analysis to correct device defects. The defect disposition and yield forecasting system is consequently able to optimize the amount of device defects in accordance with the present invention which may be corrected for different layers in the semiconductor wafer.

Figure 8:
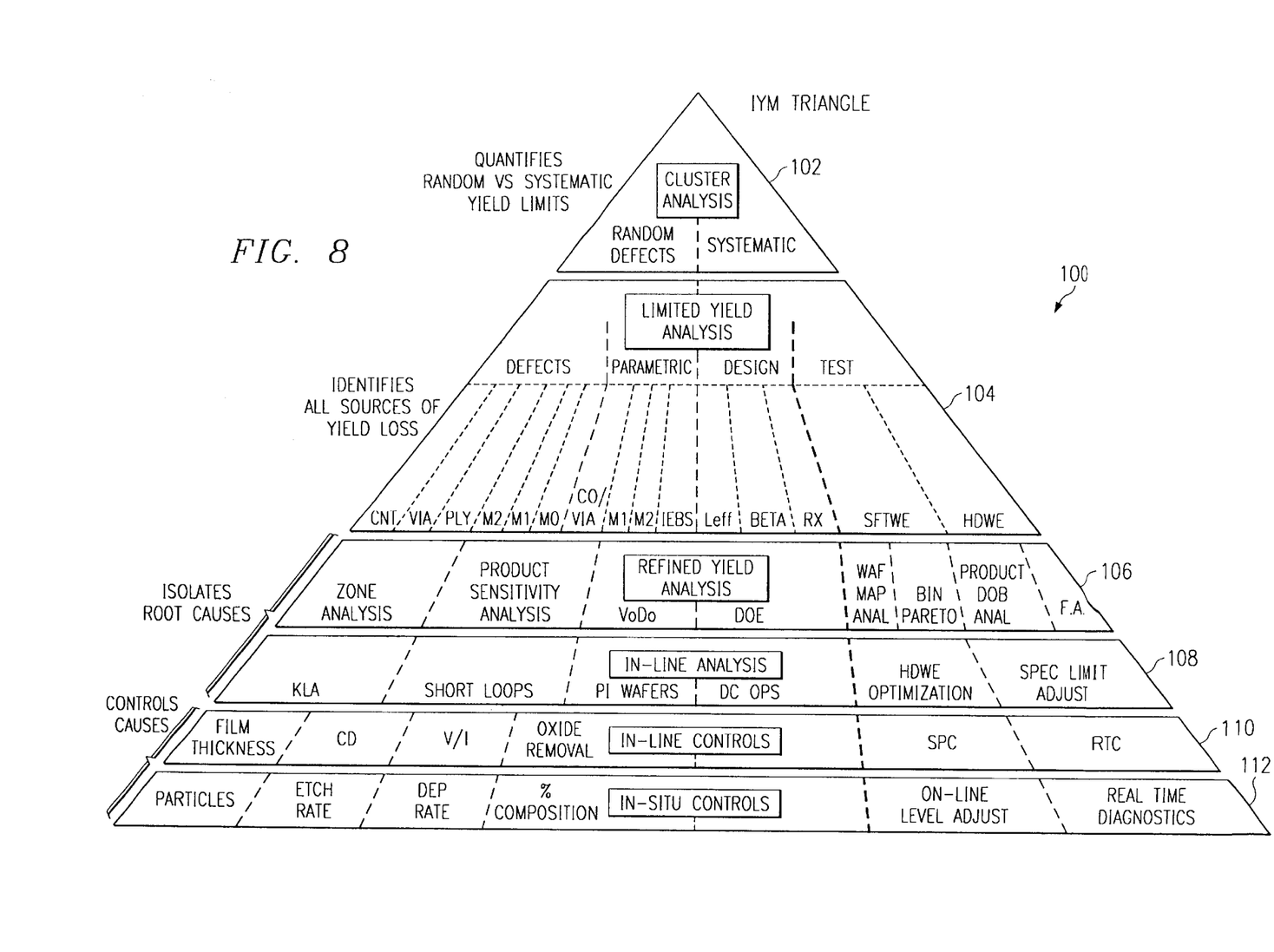
FIG. 8 illustrates a conceptual illustration of the present invention.

FIG. 8 illustrates an integrated yield management (IYM) triangle 100 showing six levels. The triangle 100 is divided into six levels, from the cluster analysis 102, which only quantifies random versus systematic yield limits, to the more detailed analysis, which gets closer to identifying root causes such as the base or in-situ controls 112. The ultimate goal portrayed at the bottom layer at in-situ controls 112 would be to control and prevent all sources of yield loss in-situ as wafers are being processed.

The yield limit typically is represented by a decimal number such as between 0 and 1, although other representations could be used, that express the maximum yield that could be achieved if the problem associated with the particular limit were the only problem that would reduce the yield below 100%. For instance, if metal 1 bridging were the only problem causing yield loss on a product, and the yield limit were 0.92, then the yield would be limited to 92% by metal bridging.

If there is another problem (for example, a product sensitivity to low beta of the NPN transistors) that limits the yield to 87%, then the "Beta" yield limit would be 0.87.

If these two problems are independent (one does not affect the other in a physical sense), then the two yield limits can be multiplied together to give the overall yield limit. Thus, if these were the only two yield problems, then $$Y_T = Y_{Bridge} * Y_{Beta} = 0.92 * 0.87 = 0.80$$

where $Y_T$ is the total or overall yield limit. Other independent yield limits can also be included in the multiplication, further lowering the total yield.

Yield losses should not be added together to compute a total yield loss because different problems can affect the same die. In the above example, if the yield losses of 8% and 13% were added, the calculated yield would be 0.79 (or 79%) which is not the actual yield loss. The more yield limits that there are and the lower the expected yield, the greater the error would be in adding yield losses.

The yield model is as follows:

$$Y = \prod_i Y_{P_i} \prod_j Y_{T_j} \prod_k Y_{S_k} \prod_l Y_{D_l} \quad (1)$$

$Y_P$= Design Yield Limits
$Y_T$= Test Yield Limits
$Y_S$= Systematic Process Limits
$Y_D$= Random Defect Yield Limits $$Y_{S_k} = \int F(S_k) * Y(S_k) dS_k \quad (2)$$

$F(S_k)$= Frequency Distribution of Parameter $S_k$
$Y(S_k)$= Yield as Function of $S_k$ $$Y_{D_l} = \frac{1}{\left(1 + \frac{\lambda_l}{\alpha}\right)^\alpha} \quad (3)$$

$$\lambda_l = \int A_C(x_l) D(x_l) dx_l$$

$\lambda_l$= Fault Density
$\alpha$= Cluster Factor
$A_C$= Critical Area for Affected Layer
$D(x_l)$= Defect Density for Defects of Size "X" and Type 1

It is, in general, the product of all of the independent yield limits. These limits may be divided up into four categories: (1) Design or Product Yield Limits—$Y_P$; (2) Systematic Process Yield Limits—$Y_S$; (3) Test Yield Limits—$Y_T$; and (4) Random Defect Yield Limits—$Y_D$.

The systematic and design yield limits are both calculated in the same way from Equation 2. This is an integral over the range of a given parameter (for example, $L_{eff}$) of the function that expresses the dependence of the yield times the frequency distribution for the parameter itself. This will be described in more details following.

The random defect yield limits are calculated from Equation 3, which is a negative binomial distribution with cluster factor (alpha) and with (lambda) representing the integral over the size distribution for each given type of defect density times the critical area for the photo layer affected by that defect type.

Cluster analysis will be described next.

This provides three pieces of information: the systematic yield limit, the random defect density, and the cluster factor (alpha). The analysis is done from actual bin wafer maps of wafers that have been through wafer probe. The die are organized into groups of 1, 2, 3, 4 (2×2), 6 (3×2), and 9 (3×3). The percent yield is then calculated for each grouping. This simulates what the yield would be for product of 2×, 3×, 4×, 6×, and 9× the die area of the actual product under consideration.

Figure 10:
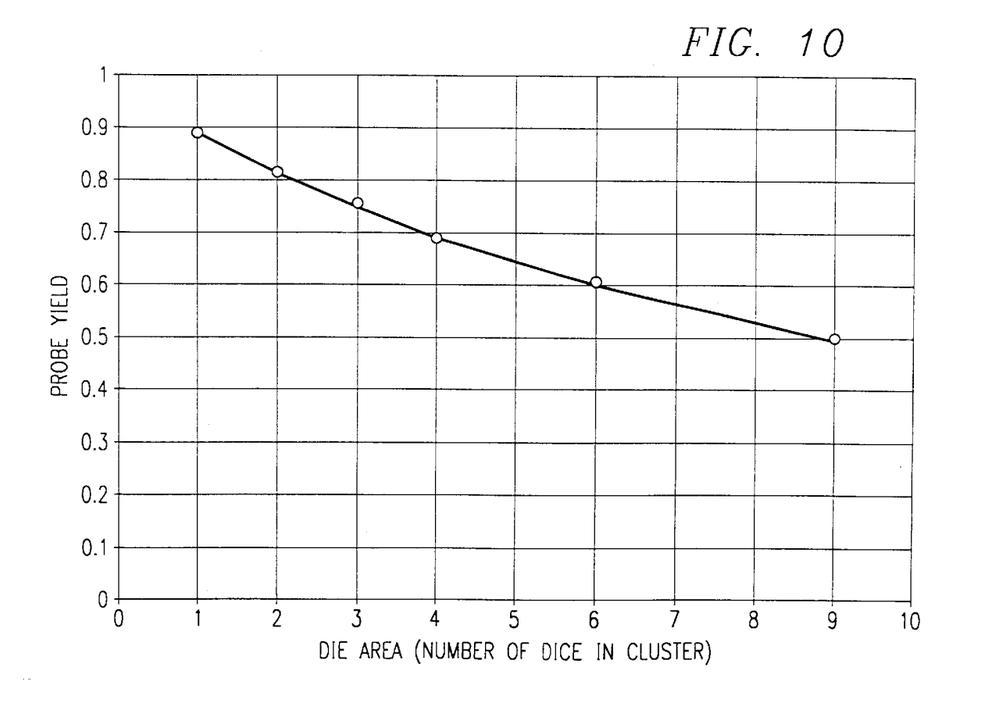
FIG. 10 illustrates a cluster analysis graph.

When these yield numbers are calculated for all die sizes up to 9×, they are plotted as illustrated in FIG. 10. Then these six points are fitted to the equation:

$$Y = \frac{Y_S}{\left(1 + \frac{AD}{\alpha}\right)^\alpha} \quad (4)$$

where:
$Y_S$ is the systematic yield limit,
D is the density of random fatal defects in units of defects per die, and the cluster factor (alpha).

These are used as three parameters whose values are optimized for the best least-squares fit to the equation.

The accuracy of this analysis is increased by increasing the number of wafers and if the average yield for all wafers for each of the block sizes is employed. Typically, at least 100 wafers should be used, and 200 wafers provides better results; however, any number of wafers provides sufficient results. The analysis gives accurate numbers for $Y_S$ and $Y_D$ but provides little or no information about the subcomponents of $Y_S$ and $Y_D$. Furthermore, it gives little or no information about the root causes of the yield limitations.

The limited yield analysis is discussed next. Next, the design, process systematic, test and random defect yield limits are reduced into their subcomponents, and each of the individual limits is quantified. This procedure allows the yield limits to be put into a pareto chart so yield improvement efforts can be prioritized. Equation 2 is used in calculating systematic (design or process) yield limits.

A design yield limit of less than 1.0 results when the product begins to fail one of the tests performed at wafer probe, as an electrical parameter (for example, NPN Beta) is either lower or higher than the nominal value but still within the specification to which the product was designed.

Figure 9:
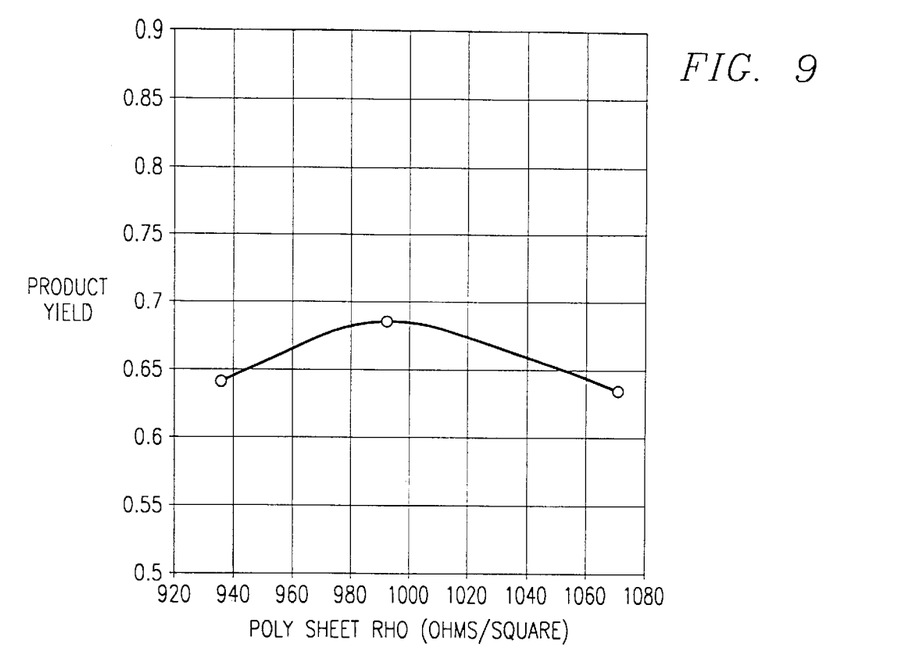
FIG. 9 illustrates a graph of mean product yield and poly sheet RHO.

FIG. 9 shows an actual example of a product for which the yield begins to fall off for both high and low values of poly resistor sheet RHO. The limited yield analysis shows this aspect, and the result was subsequently verified by performing engineering experiment lots with varying poly sheet.

Figure 11:
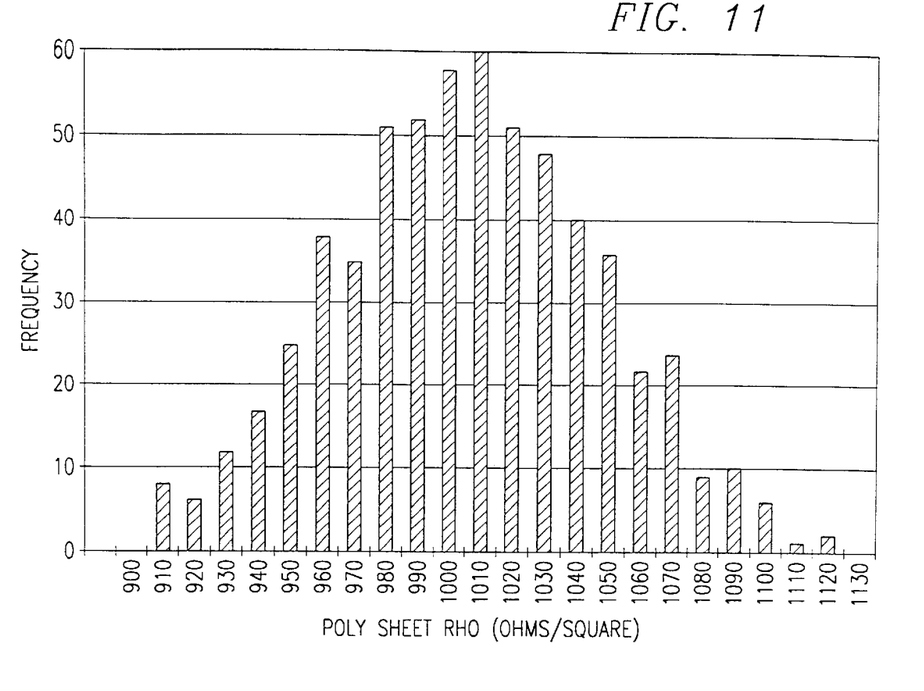
FIG. 11 illustrates poly sheet RHO frequency distribution.
Figure 12:
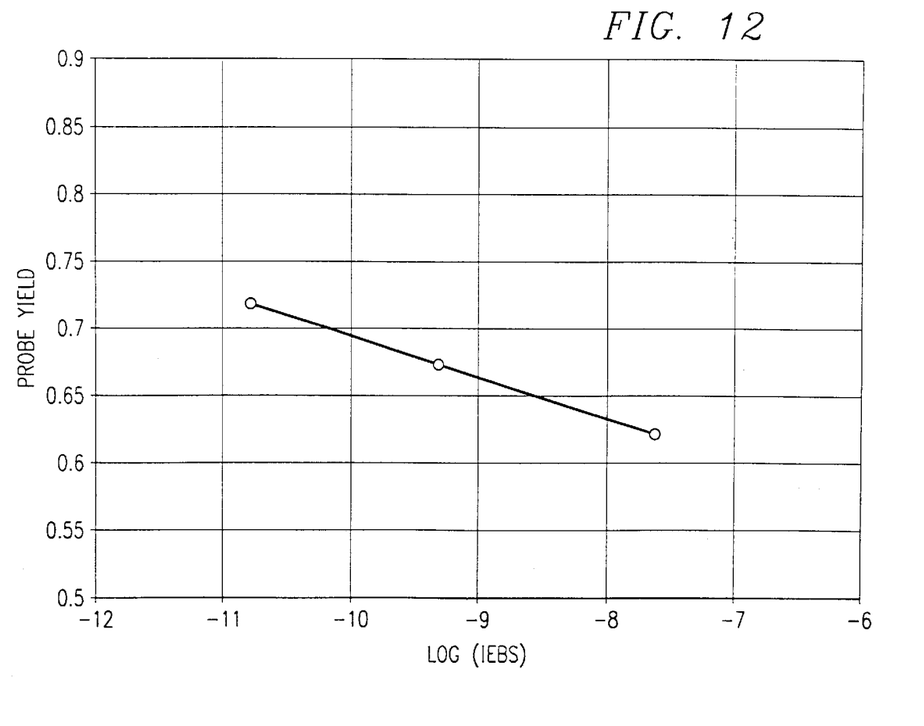
FIG. 12 illustrates a graph of mean probe yield and NPN emitter-base leakage.
Figure 13A:
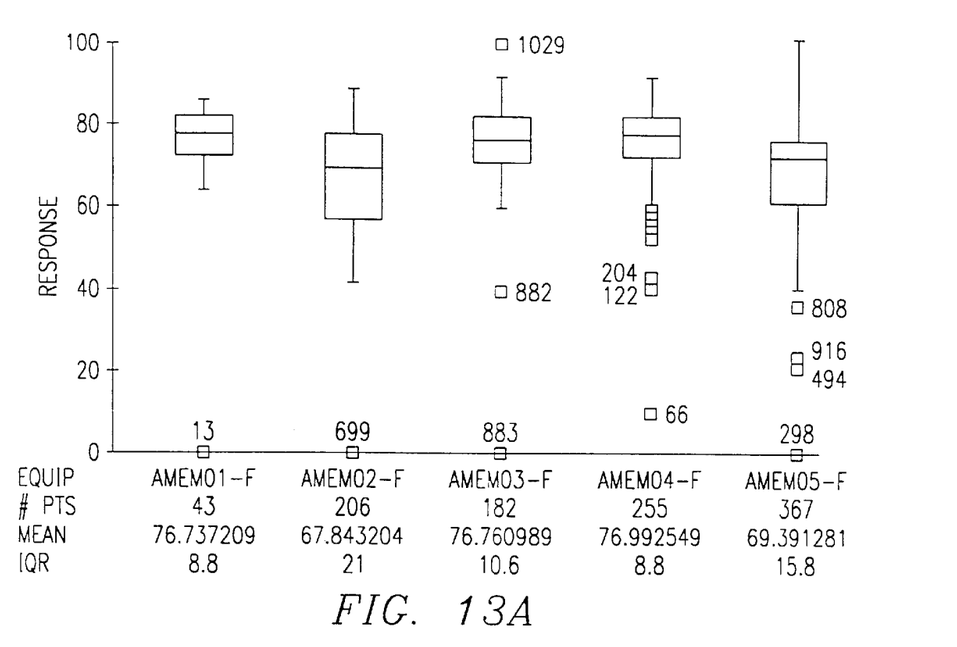
FIG. 13 illustrates an output of analysis of the present invention.
Figure 13B:
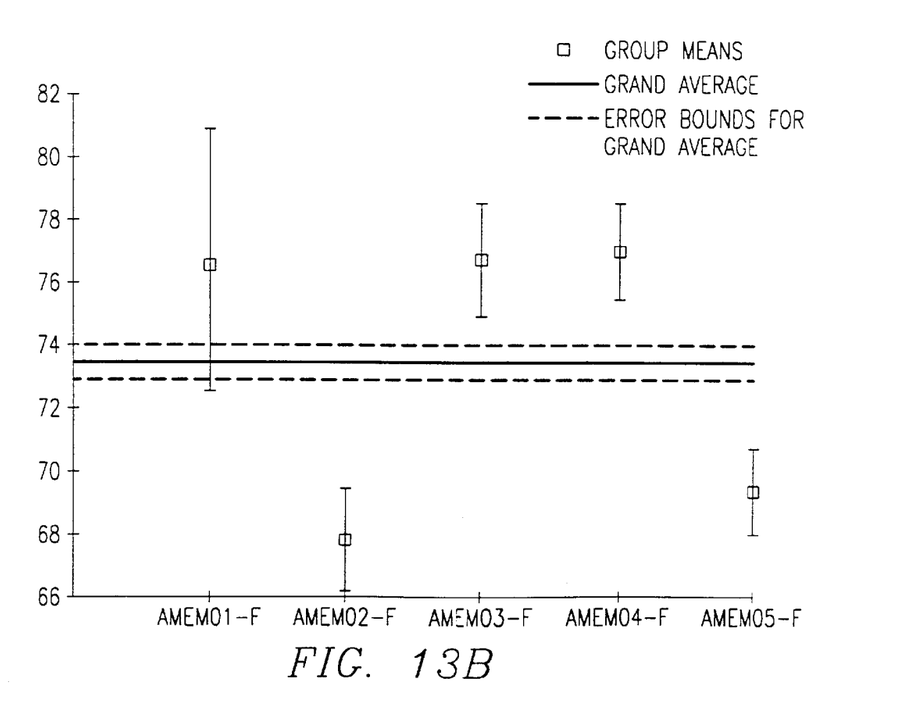
Figure 13C:
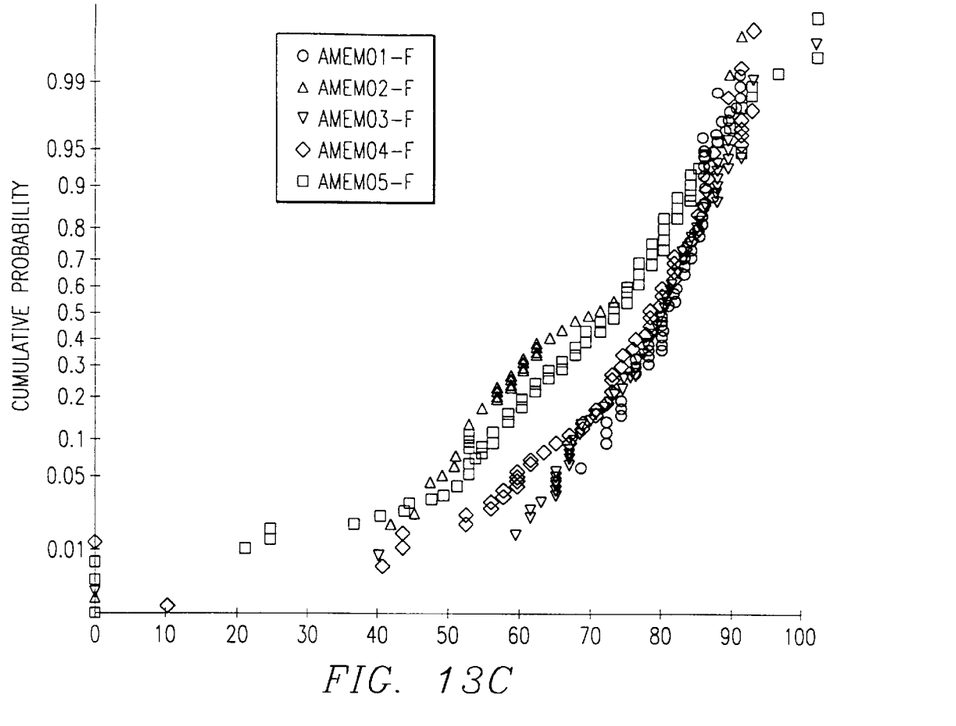
Figure 13D:
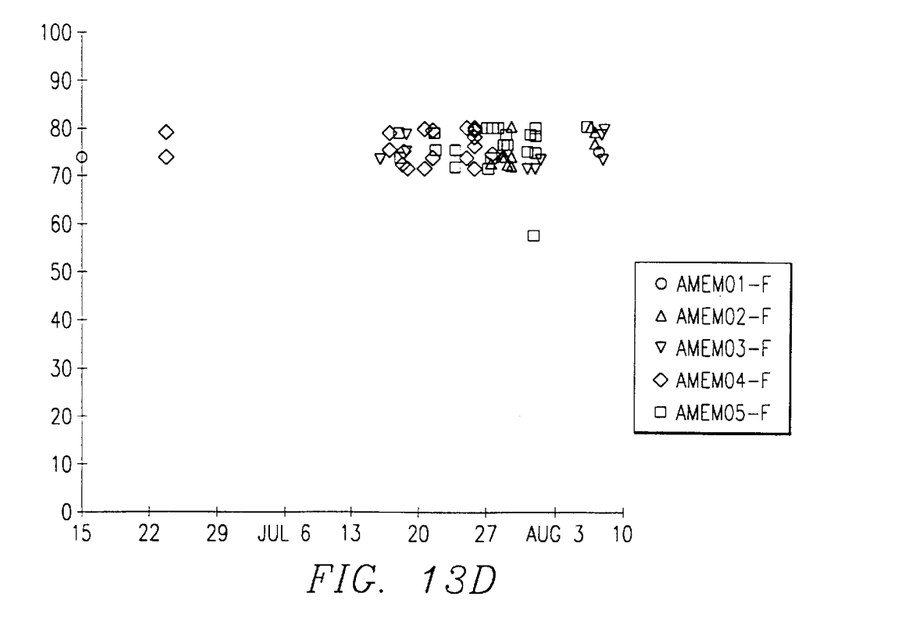

An example of a process systematic yield limit is illustrated in FIG. 11. This figure shows that the probe yield drops off as the emitter to base leakage current of an array of NPN transistors increases. The yield limit is calculated in the same way as described above in the design yield limits. Test yield limits for hardware are calculated in a similar manner by averaging the yield of product for each combination of test hardware (probe card, load board, test system, etc.). It is assumed that the hardware combination with the highest average yield is optimum, and this is normalized to 1.0. The yield limit is then calculated from:

$$Y_t = \frac{N_1 Y_1 + N_2 Y_2 + \ldots + N_{OPT} Y_{OPT} + \ldots + N_N Y_N}{N_{TOT} * Y_{OPT}}$$

where
$N_S$ is the number of wafers tested in combination,
the $Y_S$ is the corresponding yield,
and "opt" is the optimum setup.

Typically, setups with significant numbers of wafers (calculated by usual standard statistical methods) are included in the calculations. Random defect yield limits are calculated from Equation 3. A defect yield limit is calculated for each critical layer or critical process step at which defects that can cause yield loss are added to the wafers, and also for each type of defect within the process step.

The parameter lambda is calculated in several ways. One way is through the defect data generated by an in-line inspection tool such as the KLA2231 of KLA. The first method of calculating λ is to perform the integration shown in part 2 of Equation 3, where $A_C$ is the critical area of the product for a given layer, and D is the defect density as a function of defect size for a particular defect type.

Another method for calculating λ is to perform defect wafer map to probe bin map overlays and to calculate the killer probability for each defect type. In this case, λ is the product of the killer probability and the die area, and then times the defect density.

Once λ has been calculated for each defect type, the yield limits can be calculated by substituting the values of λ into the negative binomial equation ($1^{st}$ of Equation 3).

Following is an explanation of refined analysis.

The $V_0 D_0$ analysis is a tool which correlates probe yield to specific fab equipment wherein multiple pieces are used for a single process step. This analysis can be performed either for total wafer yield or for individual zones of the wafer. Correlating zone yield with equipment is preferable because it gives additional insight into possible causes of yield loss. FIG. 13 illustrates an example of the output of this analysis. The upper left graph is a box plot of the yield for each piece of equipment. The upper right graph shows whether or not the differences are statistically significant. In the lower left corner is a cumulative probability plot to distinguish overall yield differences from low yield tails. Finally, the lower right graph is a scatter plot over time to determine whether yield differences are an effect of lots going through the equipment at different times.

Figure 14:
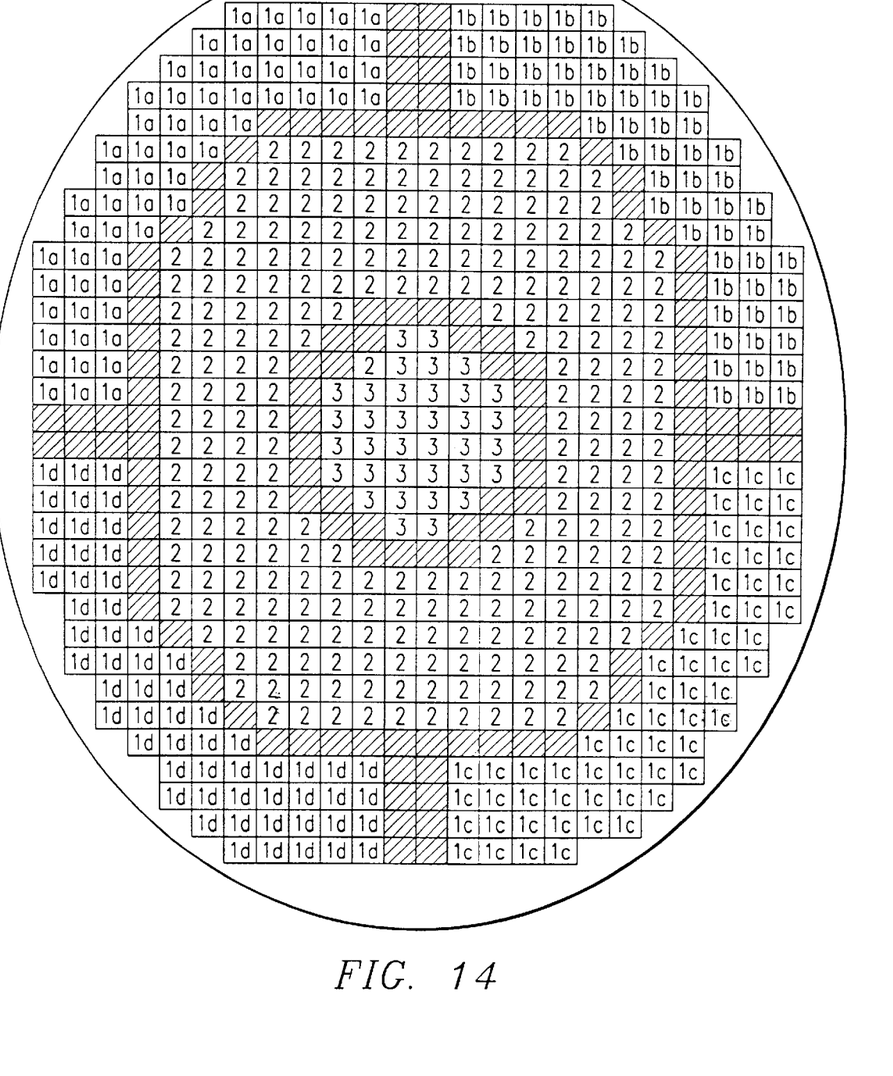
FIG. 14 illustrates zones for wafers.
Figure 15:
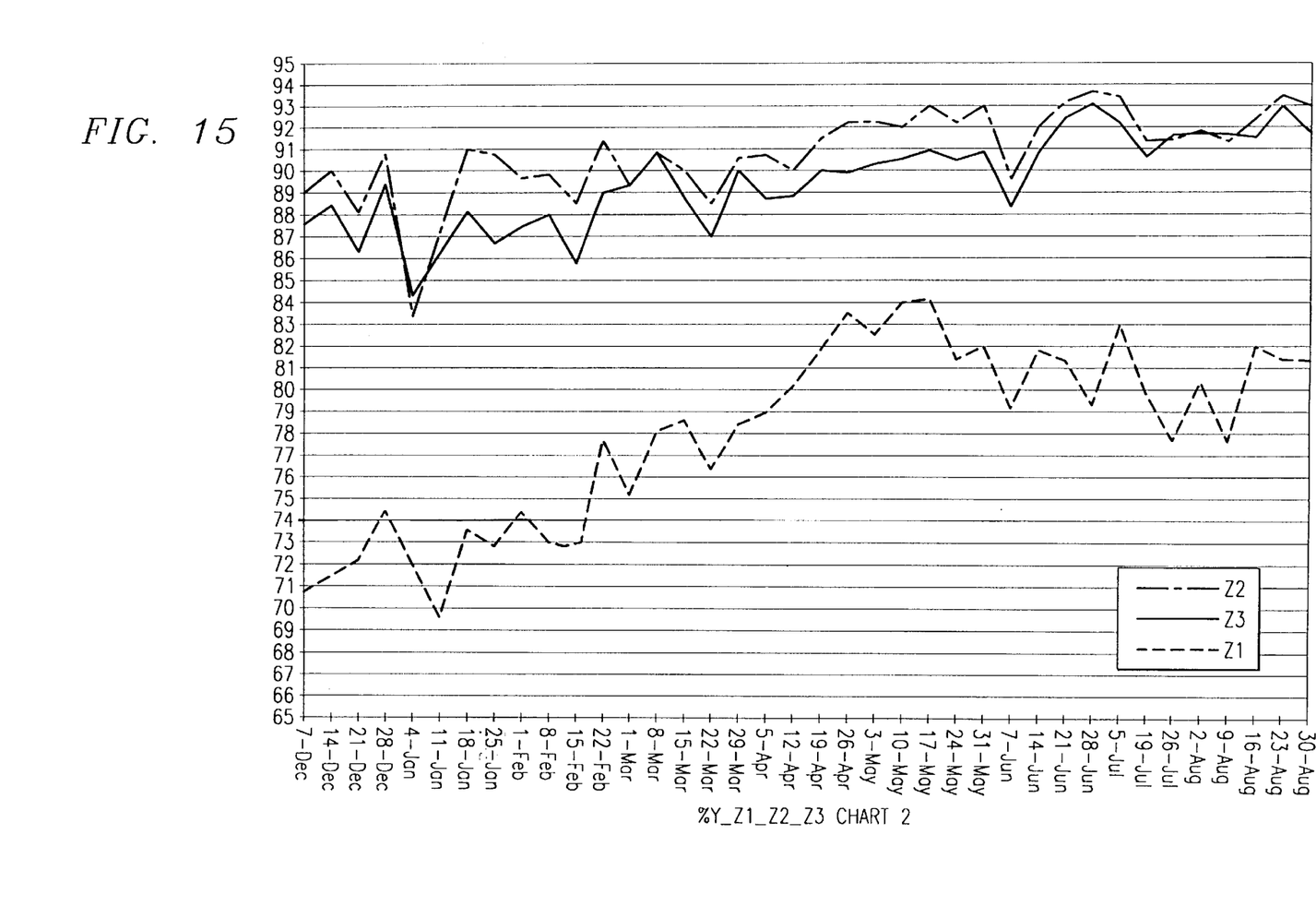
FIG. 15 illustrates a graph of yield by zone.
Figure 16:
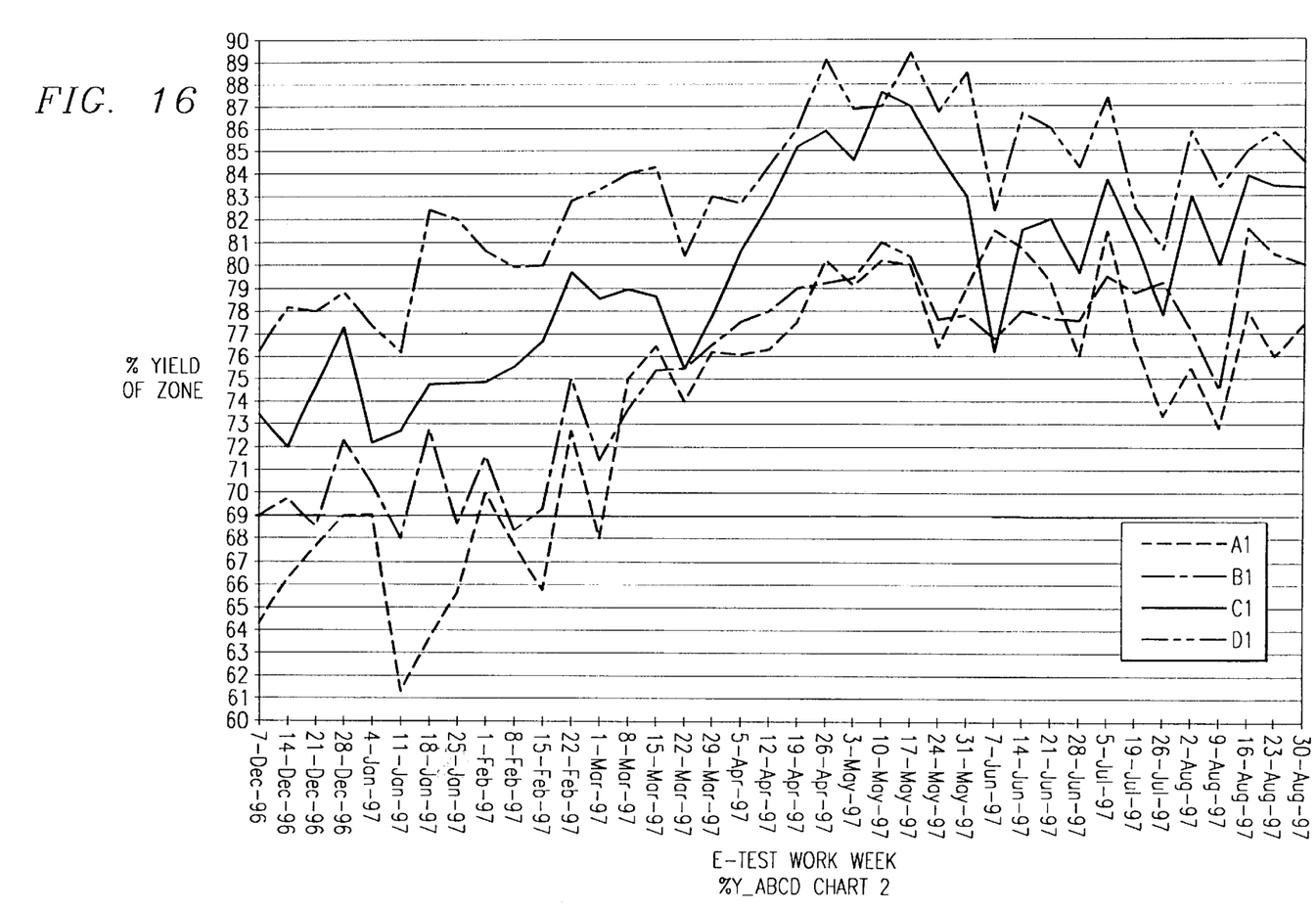
FIG. 16 illustrates a probe yield of edge quadrants.

Zone analysis makes it possible to concentrate yield improvement efforts on a specific region of the wafers which are causing the most yield loss. FIG. 14 illustrates a particular division of the wafer into zones. FIG. 15 shows trend plots of yield by (a) the three major zones, and (b) the four outer zones. Zone analysis is useful in isolating and solving several yield problems.

DOE (design of experiments) analysis is typically used after the limited yield analysis isolates an instance in which the yield falls off with variation in a given parameter. Experimental lots are run in which this parameter (or multiple parameters) are intentionally varied. The main purpose of this approach is to find out which tests (at wafer probe) begin to fail as the parameter in question varies high or low from nominal. This information can then be given to the designers (if it is a design problem) who can modify the design or change the spec limits for the appropriate test parameter at wafer probe.

Figure 17:
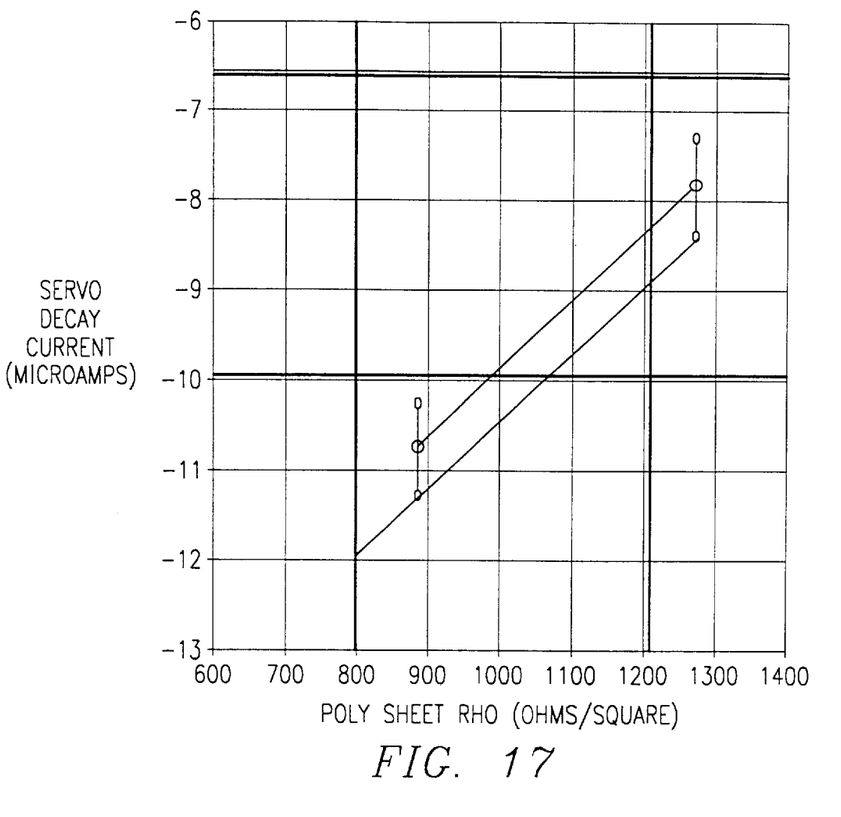
FIG. 17 illustrates a graph of servo decay current and poly sheet RHO.
Figure 18:
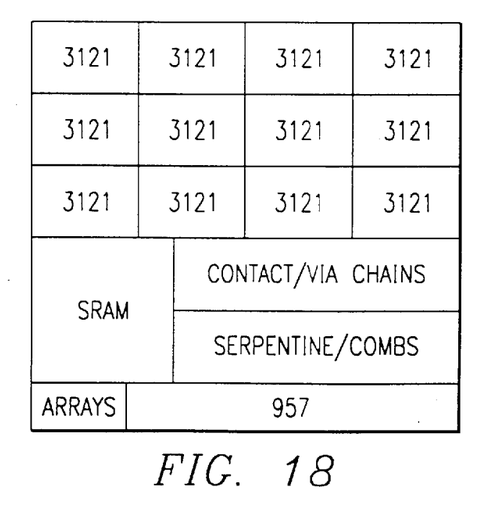
FIG. 18 illustrates a reticle layout.

FIG. 17 illustrates an example related to the poly sheet RHO referred to previously. The poly sheet spec was 800 to 1200 ohms per square, although different sizes could be used. The abscissa of the graph is a measure of the servo decay current parameter measured at wafer probe. The specification for this parameter at that time was −6.95 to −10 μAmp. The graph shows that yield loss could actually begin to occur when the poly sheet went below nominal (1000 ohms/sq). The specification in question was changed to −12 µA, at the yield loss was corrected.

Product sensitivity analysis (PSA) correlates all of the electrical parameters (for example, Vt, B, contact resistance, etc.) with individual parameters that are tested at wafer probe (output levels, offsets, filter cutoff frequency, etc.). The analysis is performed site-by-site, using probe parametric values from product die that immediately surround the electrical test sites. For each electrical parameter, the sites are grouped into three groups according to the value of the electrical parameter—low, medium, and high. The electrical parameter and the probe parameter are each averaged for the three groups of sites and plotted against each other. A least squares fit is performed on the three resulting points. The upper and lower spec limits for the electrical parameter and for the probe parameter are plotted on the graph. The least squares line for the data is extrapolated until it intersects the spec limits for the electrical parameter. If this line intersects the spec limits for the probe parameter while still inside the electrical parameter spec limits, a parametric or design sensitivity is indicated. The analysis is performed for probe parameters causing the greatest yield loss. The analysis is more sensitive and requires a smaller sample size than correlating wafer average electrical data with probe yield.

Other tools at this level of the triangle include wafer map analysis which compares stacked probe bin maps to zone yields to determine which tests result in lower yields in particular zones. Die that fail the tests high on the bin pareto are then submitted to failure analysis (FA) (microprobe, strip-back, SEM, etc.) to determine the cause of the failures.

In-line analysis is discussed next.

KLA inspections are routinely conducted at five levels during the processing of the wafers. For example, the levels are: after the isolation nitride strip, after poly etch, and after the three metal etches. Two wafers from each of about 20 lots per week are inspected at each level. A random sample of 100 defects is reviewed and classified as to type. The killer probabilities for various classifications of defects are determined by overlaying the defect maps with wafer probe bin maps. Yield limits are calculated as explained above, and projects are prioritized according to yield limit, and not according to defect densities of the various types.

Short loop reticle sets including serpentine and comb structures and contact and via chains are used mainly for reducing defect levels via short turn around engineering experiments at operations in which the above analysis has shown significant yield losses. Three points can be observed in creating these reticle sets:

1. At least two, and preferably three, different areas of structure should be used. For example, serpentine areas of 0.1, 1, and 10 square millimeters could be achieved.
2. Design rule and subdesign rule structures (~0.8X design rule) should be used. Large area subdesign rule structures can be made to provide consistent yields. Typically, the structures should be distributed over all areas of the wafers to detect regional problems.

Figure 19:
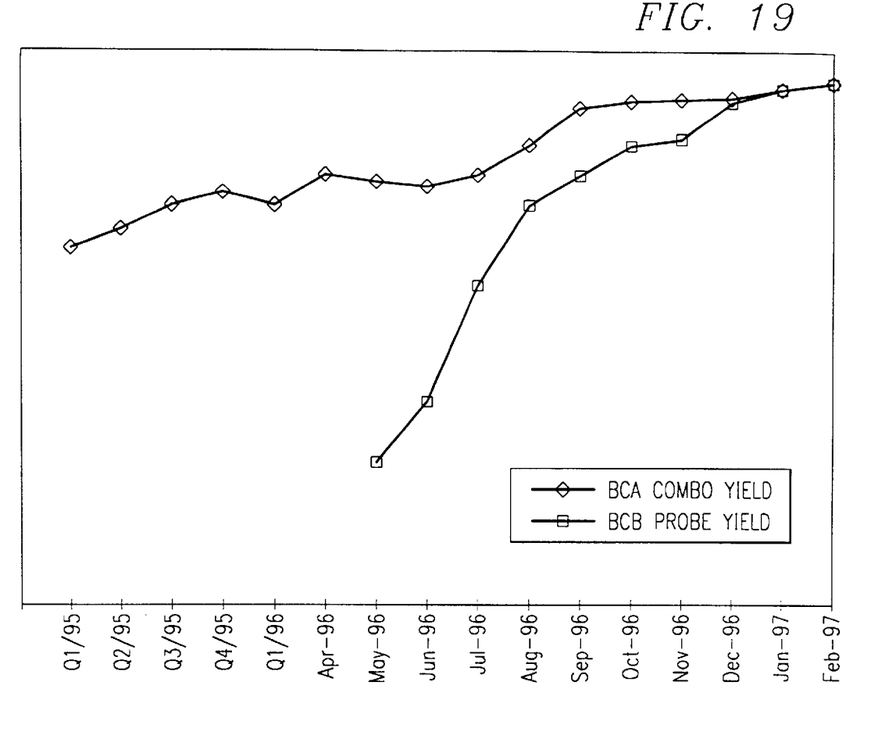
FIG. 19 illustrates probe yield learning curves.

"PI wafers" is a term used to describe wafers which have a significant portion of the area of each reticle field sacrificed for yield structures. FIG. 19 shows an example of such a wafer on which 40% of the area is used for yield structures and 60% for product. The yield structures are designed with the same criteria as listed above for short loops. They are also designed to be tested as early as possible in the process so it is not necessary to wait for finished wafers to obtain results. The reticle sets are used for all lots early in the development cycle of new technology. As yields are improved and stabilized, the proportion of lots with these structures is reduced and eventually phased out. This approach allows for quick progress up the learning curve for yields of new technologies.

DC OPS are results of in-line measurement of film thickness, critical dimensions, oxide removals, etc. If measurements correlate with yield, the results could be used to complement the defect data for a still more accurate prediction of yields.

In-line controls are implemented as SPC charts on critical parameters that are measured in line, typically after an operation is performed. Examples could be CD's, film thickness, and V/I measurements. The advantage of the approach of the present invention and using the limited yield concept is that these direct the user to the parameters which most affect yield and therefore have the highest priority for tight controls. Other parameters may only need to be sampled on a more infrequent basis. If in-line controls are used, this has the disadvantage that they are measured after a lot or group of lots have been processed. Therefore, a limited number of wafers can still be lost. In contrast, if in-situ controls can be developed for critical process steps, then deviations could be detected during the actual running of the process, and real-time adjustments could be made to correct the problem. The present invention allows probe yields to be brought to high levels in a short amount of time.

Figure 20:
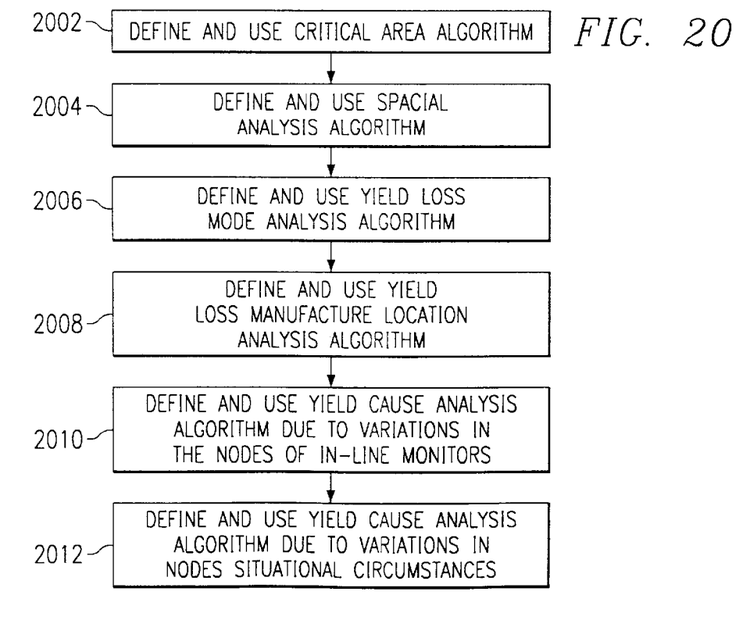
FIG. 20 illustrates a method of the present invention.

Referring to FIG. 20, the method includes the following steps.

As illustrated in step 2002, a step is illustrated including defining and using a critical area analysis algorithm that is able to accurately predict potential yield impact (for example, killer probability) of pattern disturbing defects of different sizes being randomly distributed on the wafer at different critical process steps.

As illustrated in FIG. 20, step 2004 is a step for defining and using a spacial analysis algorithm that calculates the ratio of yield loss due to randomly distributed yield loss and regionally bound yield loss. The algorithm used to calculate yield loss due to randomly distributed defects has been designed so that it matches the yield loss predicted by the critical area analysis. The remainder of the yield loss is then attributed to regionally bound yield loss. The ratio of the two types of yield loss provides a non-causal yield loss pattern analysis that measures the ratio of two distantly different spacial patterns of yield loss. These two types of yield loss are referred to as $Y_D$ and $Y_S$.

Referring to FIG. 20, in step 2006, a step is illustrated including defining and using yield loss mode analysis algorithms. These yield loss mode analysis algorithms are able to quantify the extent of yield loss that is attributed to modes that are directly related to each type of spacial yield loss ($Y_D$ or $Y_S$). The yield loss modes are designed to quantify only the yield loss attributed to the spacial yield loss type of which it is a member. The numerical integrity of the calculations established is maintained by the previously determined $Y_D$ and $Y_S$ ratio. The two yield loss modes associated with $Y_D$ type yield loss is the tester yield loss mode and the contamination yield loss mode. The two yield loss modes associated with $Y_S$ type yield loss is the parametric yield loss mode and the design yield loss mode. Because the yield loss mode analysis utilizes a different algorithm than the $Y_D/Y_S$ ratio calculation, they can be used to cross check each other.

Referring to FIG. 20 at step 2008, this step illustrates the step of defining and using yield loss manufacture location (node) analysis algorithms able to quantify yield loss at each stage of the manufacturing process for each yield loss mode. The yield loss nodes loss analysis algorithms are designed to quantify only the total yield loss attributed to the mode. This is a way in which over- or under-counting of yield loss is controlled.

In step 2010, this step includes defining and using yield loss cause analysis algorithms able to quantify yield loss at each node for each mode of yield loss due to variations in the nodes in the in-line monitors. This includes all internal real-time information provided by the equipment.

Lastly, in step 2012, this step includes defining and using yield loss cause analysis algorithms able to quantify yield loss at each node for each mode of yield loss due to variations in the nodes situational circumstances. Such variations could be maintenance schedules, number of wafers processed, chemical changes, equipment modification, etc.

The above method can be applied to explain existing yield losses and predict future yield losses from data derived from in-line production monitors. The accuracy of the line yield prediction provides a figure of merit that measures how well the production process yield loss mechanism are understood.

What is claimed is:

1. A method for integrated yield management of semiconductor wafers being inspected for defects in a factory, comprising the steps of:

defining and using a critical area analysis to predict yield impact of pattern disturbing defects;

defining and using spacial analysis to calculate the ratio of yield loss due to randomly distributed yield loss and regionally bound yield loss;

defining and using yield loss mode analysis to quantify the extent of yield loss being attributed to modes related to each type of spacial yield loss;

defining and using a yield loss manufacturing location to quantify yield loss during the manufacturing process for each yield loss mode;

defining and using yield loss cause analysis to quantify yield loss at each node for each mode of yield loss due to variations in nodes of in-line monitors; and defining and using yield loss cause analysis to quantify yield loss at each node for each mode of yield loss due to node situational circumstances.

2. An apparatus for integrated yield management of semiconductor wafers being inspected for defects in a factory, comprising:

means for a critical area analysis to predict yield impact of pattern disturbing defects;

means for spacial analysis to calculate the ratio of yield loss due to randomly distributed yield loss and regionally bound yield loss;

means for yield loss mode analysis to quantify the extent of yield loss being attributed to modes related to each type of spacial yield loss;

means for a yield loss manufacturing location to quantify yield loss during the manufacturing process for each yield loss mode;

means for yield loss cause analysis to quantify yield loss at each node for each mode of yield loss due to variations in nodes of in-line monitors; and means for yield loss cause analysis to quantify yield loss at each node for each mode of yield loss due to node situational circumstances.

* * * * *